US012650484B2

(12) United States Patent
Wang et al.

(10) Patent No.: US 12,650,484 B2
(45) Date of Patent: Jun. 9, 2026

(54) SYSTEM AND METHOD FOR CALIBRATION OF ENERGY METERS USING PHASE ANGLE CORRECTIONS

(71) Applicant: Accuenergy (Canada) Inc., Toronto (CA)

(72) Inventors: Yufan Wang, Toronto (CA); Shaohang Cui, Toronto (CA); Ketao Li, Toronto (CA); Liang Wang, Toronto (CA)

(73) Assignee: Accuenergy (Canada) Inc.

( * ) Notice: Subject to any disclaimer, the term of this patent is extended or adjusted under 35 U.S.C. 154(b) by 149 days.

(21) Appl. No.: 18/669,650

(22) Filed: May 21, 2024

(65) Prior Publication Data

US 2025/0362368 A1      Nov. 27, 2025

(51) Int. Cl.
G01R 35/00      (2006.01)
G01R 22/10      (2006.01)
G01R 25/00      (2006.01)

(52) U.S. Cl.
CPC ........... G01R 35/005 (2013.01); G01R 22/10 (2013.01); G01R 25/00 (2013.01)

(58) Field of Classification Search
CPC ....... G01R 35/005; G01R 22/10; G01R 25/00
USPC ...................................... 324/74.11, 500, 537
See application file for complete search history.

(56) References Cited

U.S. PATENT DOCUMENTS

| | | | |
|---|---|---|---|
| 7,660,682 B2 | 2/2010 | Slota et al. | |
| 8,073,642 B2 | 12/2011 | Slota et al. | |
| 8,756,029 B2 | 6/2014 | Bandsmer | |
| 9,995,815 B2 | 6/2018 | Beiner et al. | |
| 10,545,182 B2 | 1/2020 | Fu et al. | |
| 10,955,515 B2 * | 3/2021 | Suetterlin | G01R 35/005 |
| 12,196,790 B2 * | 1/2025 | Gunn | G01R 21/06 |

(Continued)

OTHER PUBLICATIONS

Acuvim-L Series: Multifunction Power and Energy Meter Users Manual, Apr. 2024, V: 4.1.3, Accuenergy Inc., https://accucdn. accuenergy.com/wp-content/uploads/Acuvim-L-Multifunction-Power-and-Energy-Meter-User-Manual-v4.pdf.

(Continued)

*Primary Examiner* — Giovanni Astacio-Oquendo
(74) *Attorney, Agent, or Firm* — Dhiraj Jindal; PATENT YOGI LLC

(57)      ABSTRACT

This invention relates to a system and method for calibrating energy meters, designed to enhance the accuracy of electrical power measurements. The system incorporates a computing device with specialized calibration software, interfaced with multiple energy meters via a network switch. Each energy meter is equipped with a CPU and DSP, facilitating precise phase angle measurements. A configurable three-phase reference source, connected via power cables, supplies standard calibration signals to the meters. The DSP measures phase angles based on calibration commands triggered by control signals received by the CPU. These measurements are then transmitted to the computing device, which calculates necessary offset corrections. The corrections are subsequently communicated back to the CPU for adjustment of the energy meters' analog-to-digital converter settings, thereby ensuring the meters' outputs are accurately aligned with calibrated standards. This system provides a robust framework for reliable, high-precision energy meter calibration.

8 Claims, 4 Drawing Sheets

100

(56)                    References Cited

U.S. PATENT DOCUMENTS

| | | | | |
|---|---|---|---|---|
| 2012/0068692 A1* | 3/2012 | Patel | ..................... | G01R 15/207 |
| | | | | 324/202 |
| 2013/0191053 A1* | 7/2013 | Spanier | .................. | G01R 22/10 |
| | | | | 702/60 |
| 2023/0236275 A1* | 7/2023 | Teboulle | ................ | G01R 22/06 |
| | | | | 324/74 |
| 2024/0377477 A1* | 11/2024 | Murakami | ........... | G01R 25/005 |

OTHER PUBLICATIONS

AcuRev 2100 Series: Multi-Circuit Submeter, Version: 1.1.2 Revised: Mar. 2024, Accuenergy Inc., https://accucdn.accuenergy.com/wp-content/uploads/AcuRev-2100-Multi-Circuit-Power-Energy-Meter-User-Manual.pdf.

\* cited by examiner

SYSTEM AND METHOD FOR CALIBRATION OF ENERGY METERS USING PHASE ANGLE CORRECTIONS

FIELD OF THE INVENTION

The present disclosure generally relates to the field of energy meters for electrical utility services and, specifically to systems and methods for calibrating energy meters.

BACKGROUND

The accurate measurement of electrical energy consumption is critical for utility providers, businesses, and consumers, particularly in the context of billing, energy management, and grid stability. Traditional energy meters often rely on analog mechanisms which, while generally reliable, can suffer from inaccuracies due to component wear, environmental factors, and inherent limitations in their measurement technologies.

With the advent of digital technology, energy meters have incorporated sophisticated electronic components such as Digital Signal Processors (DSPs) and Central Processing Units (CPUs) to enhance accuracy and functionality. These digital meters can process signals and data more precisely, allowing for better detection and correction of errors in electricity measurement.

However, even digital meters require regular calibration to maintain accuracy. Calibration typically involves comparing the meter's measurements against a known reference standard and adjusting the meter's settings to correct any deviations. This process has historically been complex, time-consuming, and often requires manual adjustments by skilled technicians, making calibrations logistically challenging and costly.

Therefore, further improvements in the calibration of energy meters would be desirable.

SUMMARY OF THE INVENTION

The present invention relates to a system and method for calibrating energy meters. The system includes a computing device equipped with specialized calibration software that manages calibration activities and interfaces with multiple energy meters. Each energy meter within the system incorporates a Central Processing Unit (CPU) and a Digital Signal Processor (DSP), which are crucial for the processing and measurement tasks essential to calibration.

The calibration system further includes a network switch that connects the computing device to the energy meters via an Ethernet cable, facilitating robust and reliable communication. This setup ensures that calibration commands and data can be transmitted efficiently between the computing device and the meters.

A key component of the system is a reference source that is connected to each of the energy meters through a power cable. This reference source is capable of delivering a three-phase power output, which is configurable through the computing device to various specifications such as voltage, current, power factor, and frequency. This feature allows the system to simulate different electrical conditions to test the performance of the meters under varied scenarios, thus enhancing the flexibility and applicability of the calibration process.

In operation, the DSP of each energy meter is configured to measure phase angles for each measurement channel in response to a calibration command. This command is initiated by the CPU after it receives a predefined control signal from the computing device. The measured phase angles are then transmitted to the computing device through the CPU via the network switch.

The computing device is responsible for computing an offset correction for each measurement channel based on the received measured phase angles. These offset corrections are crucial for adjusting the settings of an analog-to-digital converter within the energy meters, aligning measurement accuracy with calibrated standards.

The method of calibrating energy meters involves calculating average phase angles for each measurement channel, determining phase angle errors by comparing these calculated averages to expected values, identifying the maximum phase angle error, and computing offset corrections for each measurement channel. These steps ensure that each energy meter within the system is calibrated precisely, according to standardized parameters that enhance measurement reliability and accuracy.

In addition, the system provides a user interface on the computing device that displays the progress and results of the calibration process. This interface allows operators to monitor the calibration in real-time and provides visual feedback and logs that help in maintaining accurate records of the calibration activities.

This invention provides a detailed, methodical approach to energy meter calibration that significantly improves the efficiency and precision of such activities. By automating much of the process and enabling real-time feedback and adjustment, the system reduces the time required for calibration and increases the reliability of the meters in measuring electrical parameters accurately. Furthermore, the scalable nature of the system makes it suitable for a wide range of applications, from small-scale installations to large power distribution networks, thereby enhancing its utility and applicability across various settings.

BRIEF DESCRIPTION OF THE DRAWINGS

The forgoing and other advantages of the present disclosure will become apparent upon reading the following detailed description and upon reference to the drawing.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimension, and materials are illustrated for the various elements, those skilled in the art will recognize that many of the examples provided have suitable alternatives that may be utilized.

Figure 1:
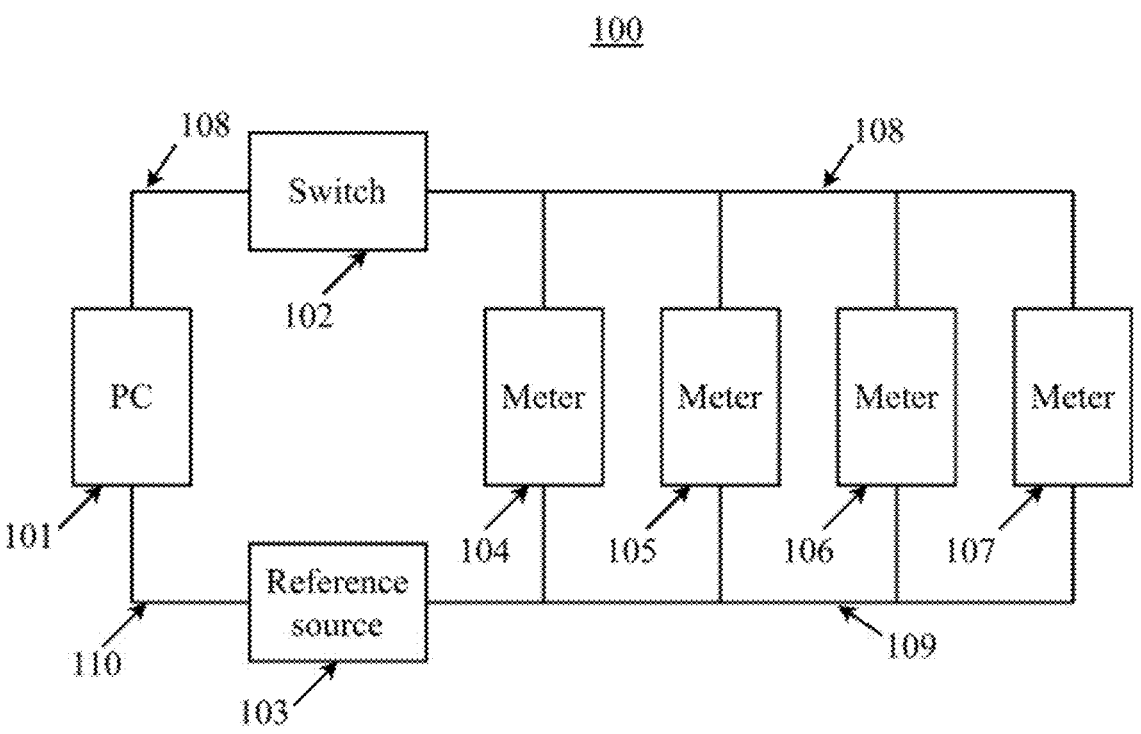
FIG. 1 illustrates the energy meter calibration system, showcasing a comprehensive arrangement designed for precision and efficiency according to some embodiments of the present invention.

FIG. 1 illustrates the energy meter calibration system 100, which encompasses a comprehensive arrangement designed for precision and efficiency. At the heart of the system is the Personal Computer (PC) 101, equipped with specialized calibration software. This software is integral for managing all calibration-related activities, providing a user interface that allows for the input of calibration parameters and enables the viewing of real-time feedback from the energy meters. The PC is connected via an Ethernet cable 108 to a network switch 102, which serves as a central networking hub. This switch facilitates robust network communication using the Modbus TCP/IP protocol and connects the PC 101 with multiple energy meters, numbered 104 through 107, ensuring reliable and fast data transmission across the devices.

A crucial component of this system is the Reference Source 103, which delivers a highly accurate three-phase power output that can be configured to specific voltages, currents, power factors, and frequencies; for example, 120 V, 1 A, with a power factor of 0.5 and a frequency of 50 Hz. This reference source is directly linked to each of the energy meters via appropriate cabling, thus providing the standard power necessary for the calibration accuracy assessments. The PC 101 manipulates the settings of the Reference Source 103 via an RS232 connection, allowing for precise control over the calibration parameters.

The calibration process involves each of the energy meters, which are connected to both the network switch 102 and the reference source 103. During calibration, these meters not only receive power input from the reference source but also data and command inputs from the PC 101. Upon receiving a calibration command from the PC, each meter measures the input from the Reference Source 103, compares it against expected metrics, and accordingly adjusts its internal configuration parameters.

Reference Source 103 is connected to each of the energy meters 104-107 via power cable 109. This connection facilitates the direct transmission of the reference power signals from the reference source to the energy meters, ensuring that each meter receives a precisely controlled power input necessary for accurate calibration.

The operational workflow is initiated by the PC 101, which sets the desired parameters on the Reference Source 103. Through the Modbus TCP/IP protocol, the PC then sends calibration commands to each connected energy meter. As part of the data acquisition and adjustment phase, the meters measure the reference power and transmit the results back to the PC, which analyzes these data. If discrepancies are identified, further adjustments and retests are performed until the meters meet the predefined accuracy standards.

In some embodiments, the reference source is further configured to adjust its output based on commands from the computing device, allowing for variations in voltage, current, power factor, and frequency to test meter performance under different electrical conditions.

The enhanced functionality of the reference source within the calibration system for energy meters is designed to comprehensively evaluate and adjust the performance of the meters under variable electrical conditions. This functionality is achieved by enabling the reference source to receive and execute commands from the computing device that dictate specific output settings. These settings include adjustments to the voltage, current, power factor, and frequency parameters.

To implement this feature, the reference source is equipped with control circuitry that interfaces with the computing device. Upon receiving a command, this control circuitry adjusts the electrical output of the reference source accordingly. For example, if the calibration process requires testing the energy meters under low voltage and high current conditions, the computing device sends a command specifying these parameters. The control circuitry then manipulates the internal configurations of the reference source, such as switching regulators or transformer taps, to generate the desired output.

Furthermore, the reference source includes sensors and feedback mechanisms that monitor its output and ensure that it conforms to the commanded specifications. This feedback is relayed back to the computing device, which may make further adjustments to the command parameters based on real-time data, ensuring precise control over the calibration conditions.

This system provides operators with the ability to simulate a wide range of electrical conditions, thereby thoroughly testing and calibrating energy meters to function accurately across different scenarios. Such capability is crucial for ensuring that the meters perform reliably when deployed in environments where electrical conditions can vary significantly due to factors like load changes or supply fluctuations.

In summary, the reference source's ability to adjust its output based on commands from the computing device enables a flexible and dynamic calibration process. By incorporating control circuitry, feedback mechanisms, and interfacing capabilities, the system ensures that energy meters are tested and calibrated under conditions that mimic the variety of electrical environments they will encounter in actual use, thereby validating their accuracy and reliability in a controlled, repeatable manner.

In some embodiments, the calibration software is configured to receive real-time feedback from the energy meters during the calibration process, enabling dynamic adjustments to the calibration parameters based on the feedback received.

In the described system, the calibration software plays a pivotal role in enhancing the calibration accuracy and efficiency of energy meters by being configured to receive real-time feedback directly from the meters during the calibration process. This capability is crucial for making dynamic adjustments to the calibration parameters, ensuring that the calibration process is both responsive and precise.

The software architecture is designed to maintain a continuous communication loop with each connected energy meter via the network switch and computing device interface. As the calibration process unfolds, the energy meters transmit data reflecting their performance under the test conditions set by the reference source. This data may include measurements of voltage, current, frequency, and power factor, which are critical to evaluating the meters' accuracy.

Upon receiving this feedback, the calibration software analyzes the data to determine if the energy meters' responses align with expected outcomes based on the known parameters set by the reference source. If discrepancies are detected, the software calculates the necessary adjustments to the calibration parameters and immediately sends commands to modify the settings on the reference source. For example, if the feedback indicates that a meter is consistently under-reporting voltage at a specific setting, the software can adjust the calibration coefficient for voltage in that meter to compensate for the observed error.

To implement this functionality, the calibration software is integrated with algorithms capable of processing complex datasets in real time and applying predictive and corrective analytics to refine the calibration process. These algorithms are supported by a robust hardware interface within the computing device that can handle high-speed data transmissions and execute commands with minimal latency.

Additionally, the system includes user interface elements that allow operators to monitor the real-time data and the adjustments being made. This feature provides transparency and control over the calibration process, enabling technicians to manually override automatic adjustments if necessary and to fine-tune the calibration parameters based on their expert judgment.

This detailed configuration allows for a calibration process that not only automates adjustments based on real-time feedback but also adapts to the unique characteristics of each meter, thereby ensuring optimal performance and accuracy post-calibration.

In some embodiment, the system further comprises a user interface on the computing device that displays the progress and results of the calibration process, providing visual confirmation and logs of calibration accuracy for each connected energy meter.

In the enhanced energy meter calibration system, a user interface on the computing device is a key component that enhances the user experience and operational efficiency by providing visual feedback on the calibration process. This interface is designed to display a comprehensive overview of the calibration progress and detailed results for each energy meter connected to the system.

The user interface is crafted to display real-time updates as the calibration progresses. It visualizes data flow from the reference source to the energy meters and back to the computing device, where the DSP and CPU process and analyze the data. By integrating graphical representations of the calibration status, such as progress bars, gauges, or digital readouts, technicians can visually track the calibration's progress against expected benchmarks and timelines.

Furthermore, the interface provides detailed logs of the calibration results for each meter. These logs include critical parameters such as voltage, current, and phase angles, along with any adjustments made during the calibration. This feature allows for historical tracking of each meter's performance and the effectiveness of the calibration process over time. It also aids in quality assurance by providing a transparent record of each meter's calibration history, which can be essential for compliance with industry standards and troubleshooting future issues.

The user interface also includes functionality to alert technicians to any discrepancies or errors detected during the calibration. For instance, if a meter does not align with the expected calibration outcomes, the interface can highlight these discrepancies and provide detailed error reports. This immediate feedback allows technicians to make prompt decisions about necessary re-calibrations or adjustments.

Designed to be user-friendly, the interface is accessible to technicians of varying skill levels, ensuring that minimal training is required to operate the system effectively. It supports intuitive navigation through touch-screen controls or mouse-based interactions, depending on the hardware configuration of the computing device.

To implement this feature, the system utilizes standard programming languages and frameworks suitable for developing interactive user interfaces, such as JavaScript, HTML5, and CSS for web-based interfaces or Java and Swift for standalone applications. The interface is connected to the back-end system where the calibration data is processed, ensuring seamless synchronization between the data processing units and the display elements.

By providing these capabilities, the user interface not only enhances the operational functionality of the calibration system but also ensures compliance with industry practices by enabling detailed monitoring and reporting of calibration activities.

In some embodiments, the computing device uses Modbus TCP/IP protocol for communication, facilitating standardized and secure data exchange with the energy meters.

The calibration system utilizes the Modbus TCP/IP protocol for communication, which is integral to establishing a standardized and secure data exchange between the computing device and the energy meters. This protocol is widely recognized and adopted in industrial applications for its reliability and ease of integration, making it an ideal choice for systems requiring robust data communication like those involved in energy meter calibration.

The use of Modbus TCP/IP enables the computing device to send and receive commands and data over a network that includes energy meters, each equipped with a CPU and a DSP. This protocol operates over TCP (Transmission Control Protocol) and IP (Internet Protocol) networks, which are standard in commercial and industrial settings, providing a method for the computing device to issue commands to the meters and receive data in a format that is universally understood and supported.

In implementing this communication protocol, the system uses standard network hardware such as Ethernet cables and network switches to connect the computing device with the energy meters. The computing device acts as a master in the Modbus network, querying the meters, which function as slaves, for their data. This setup allows for efficient polling of measurement data from multiple meters, making it possible to handle large-scale deployments typically found in utility environments.

For security, the Modbus TCP/IP protocol within the system can be enhanced with additional security measures such as VPNs (Virtual Private Networks), SSL/TLS (Secure Sockets Layer/Transport Layer Security) for encrypting the data transmitted across the network, and firewall configurations that restrict unauthorized access. These security measures are essential, especially in environments where sensitive data regarding power usage and system integrity are transmitted.

Setting up the Modbus TCP/IP communication in the calibration system involves configuring the network addresses and settings on both the computing device and the energy meters. Each device on the network is assigned a unique IP address and configured to recognize Modbus TCP/IP commands and responses. The system software on the computing device includes drivers and libraries that support Modbus TCP/IP communication, allowing seamless integration and communication with any compliant device.

Thus, the inclusion of Modbus TCP/IP in the calibration system not only facilitates efficient and secure communication across the network but also ensures compatibility with a wide range of existing industrial equipment.

The system's advantages are manifold, including its precision, which utilizes a high-accuracy reference source ensuring that each meter is calibrated against a standard benchmark. It significantly reduces the time required for calibration by automating the process and enabling simultaneous calibration of multiple meters. Additionally, the system is scalable, easily accommodating additional meters by simply integrating them into the existing network infrastructure, thereby enhancing the system's utility and applicability in various settings. This detailed arrangement not only streamlines the calibration process but also ensures high standards of accuracy and operational efficiency.

Figure 2:
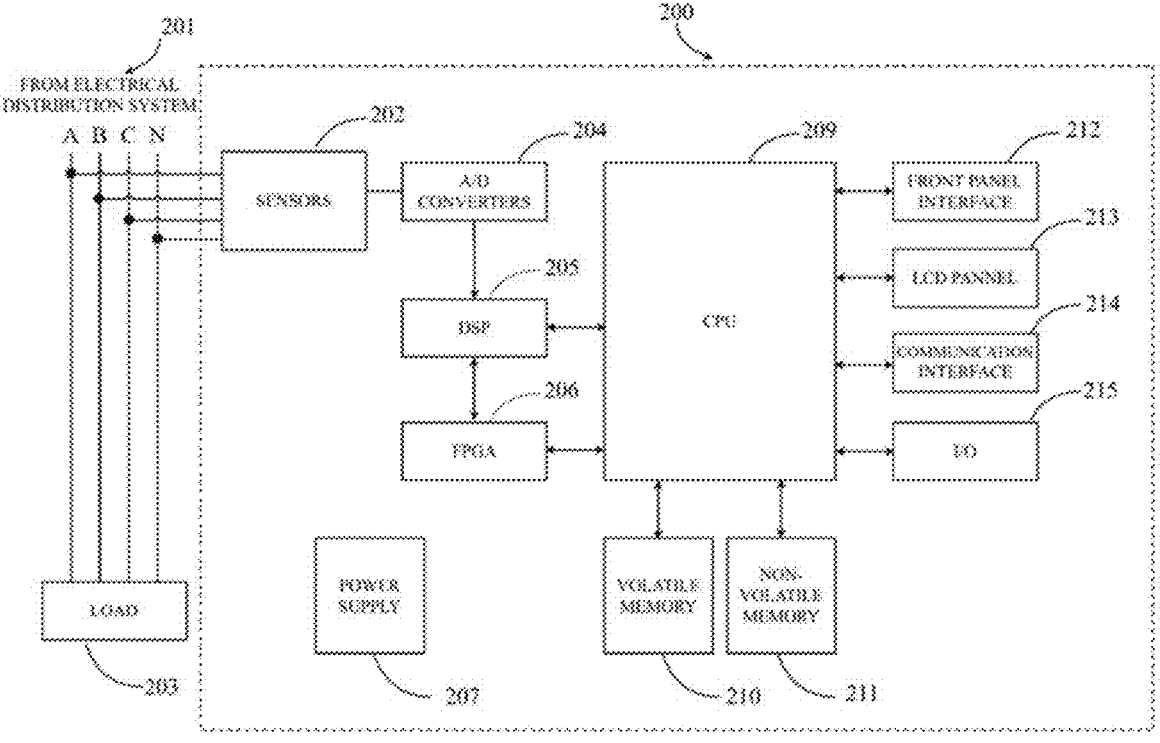
FIG. 2 is a block diagram of an energy meter, which is designed for monitoring power usage and power quality at any metered point within an electrical distribution system.

FIG. 2 is a block diagram of an energy meter 200 for monitoring power usage and power quality for any metered point within an electrical distribution system 201.

The energy meter 200 illustrated in FIG. 2 includes multiple sensors 202 coupled with various phases A, B, C, and N (neutral) of an electrical distribution system 201, multiple analog-to-digital (A/D) converters 204, a power supply 207, volatile memory 210, non-volatile memory 211, a front panel interface 212, and a processing module that includes at least one Central Processing Unit (CPU) and/or one or more Digital Signal Processors (DSP), two of which are shown DSP 205 and CPU 209. The energy meter 200 also includes a Field Programmable Gate Array (FPGA) 206 which performs several functions, including acting as a communications bridge for transferring data between the various processors (205 and 209).

The sensors 202 sense electrical parameters, such as voltage and current, on incoming lines (phase A, phase B, phase C, and neutral N) of an electrical power distribution system 201 that are coupled to at least one load 203 that consumes the provided power. In one embodiment, the sensors 202 include current transformers and potential transformers, where one current transformer and one voltage transformer will be coupled to each phase of the incoming power lines. The primary winding of each transformer will be coupled to the incoming power lines and the secondary winding of each transformer will output a voltage representative of the sensed voltage and current. The output of each transformer will be coupled with the A/D converters 204 which are configured to convert the analog voltage output from the transformer to a digital signal that can be processed by the DSP 205.

In some embodiments, digital signal of DSP 205 is transmitted to a gate array, such as Field Programmable Gate Array (FPGA) 206. The digital signal is then transmitted from the FPGA 206 to the CPU 209.

The CPU 209 or DSP Processors 205 are configured to receive digital signals from the A/D converters 204 and perform the necessary calculations to determine power usage and control the overall operations of the energy meter 200. In some embodiments, the CPU 209 and DSP 205 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 206. In some embodiments, the digital samples, which are output from the A/D converters 204 are sent directly to the CPU 209, effectively bypassing the DSP 205 and the FPGA 206 as a communications gateway.

The power supply 207 provides power to each component of the energy meter 200. In one embodiment, the power supply 207 is a transformer with its primary windings coupled to the incoming power distribution lines to provide a nominal voltage at its secondary windings. In other embodiments, power may be supplied from an independent power source to the power supply 207.

In FIG. 2, the front panel interface 212 is shown coupled to the CPU 209 which includes indicators, switches, and various inputs.

In FIG. 2, the LCD panel with touchscreen 213 is shown coupled to the CPU 209 for interacting with a user and for communicating events, such as alarms and instructions. The LCD panel with touchscreen 213 may provide information to the user in the form of alpha-numeric lines, computer-generated graphics, videos, animations, etc.

An input/output (I/O) interface 215 may be provided for receiving externally generated inputs from the energy meter 200 and for outputting data, such as serial data, to other devices. In one embodiment, the I/O interface 215 may include a connector for receiving various cards and/or modules that increase and/or change the functionality of the energy meter 200.

The energy meter 200 also includes volatile memory 210 and non-volatile memory 211. The volatile memory 210 will store the sensed and generated data for further processing and for retrieval when requested to be displayed at the energy meter 200 or from a remote location. The volatile memory 210 includes internal storage memory, such as Random-Access Memory (RAM). The non-volatile memory 211 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including time-stamps), and stored digital samples for later download to a client application, webserver, or PC application.

In a further embodiment, the energy meter 200 will include a communication interface 214, also know as a network interface, for enabling communications between meter, and a remote terminal unit or programmable logic controller and other computing devices, microprocessors, desktop computers, laptop computers, other meter modules, etc. The communication interface 214 may be a modem, Network Interface Card (NIC), wireless transceiver, or other interface. The communication interface 214 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The energy meter 200 may communicate to a server or other computing device via the communication interface 214. The energy meter 200 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one energy meter and/or storing data to be retrieved by the energy meter.

In an additional embodiment, when a power event occurs, such as a voltage surge, voltage sag, or current short circuit, the energy meter 200 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 209 to compute other electrical parameters such as harmonics, magnitudes, symmetrical components, and phasor analysis.

In a further embodiment, the energy meter 200 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which energy meter firmware and/or software can be upgraded. An event command can be issued by a user, on a schedule, or through a digital communication that will trigger the energy meter 200 to access a remote server and obtain the new program code. This will ensure that program data will be maintained, assuring the user that all information is displayed identically on all units.

It is to be understood that the present disclosure may be implemented in various forms of hardware, software, firmware, special purpose processors, or a combination thereof. The energy meter 200 also includes an operating system and application programs. The various processes and functions described herein may either be part of an application program (or a combination thereof) which is executed via the operating system.

Because some of the system components and methods depicted in the accompanying figures may be implemented using either software or firmware, it is to be further understood that the actual connections between the system components (or the process steps) may differ depending on the specific way the present disclosure is programmed. Given the teachings of the present disclosure provided herein, one of ordinary skill in the related art will be able to contemplate these and similar implementations or configurations of the present disclosure.

Figure 3:
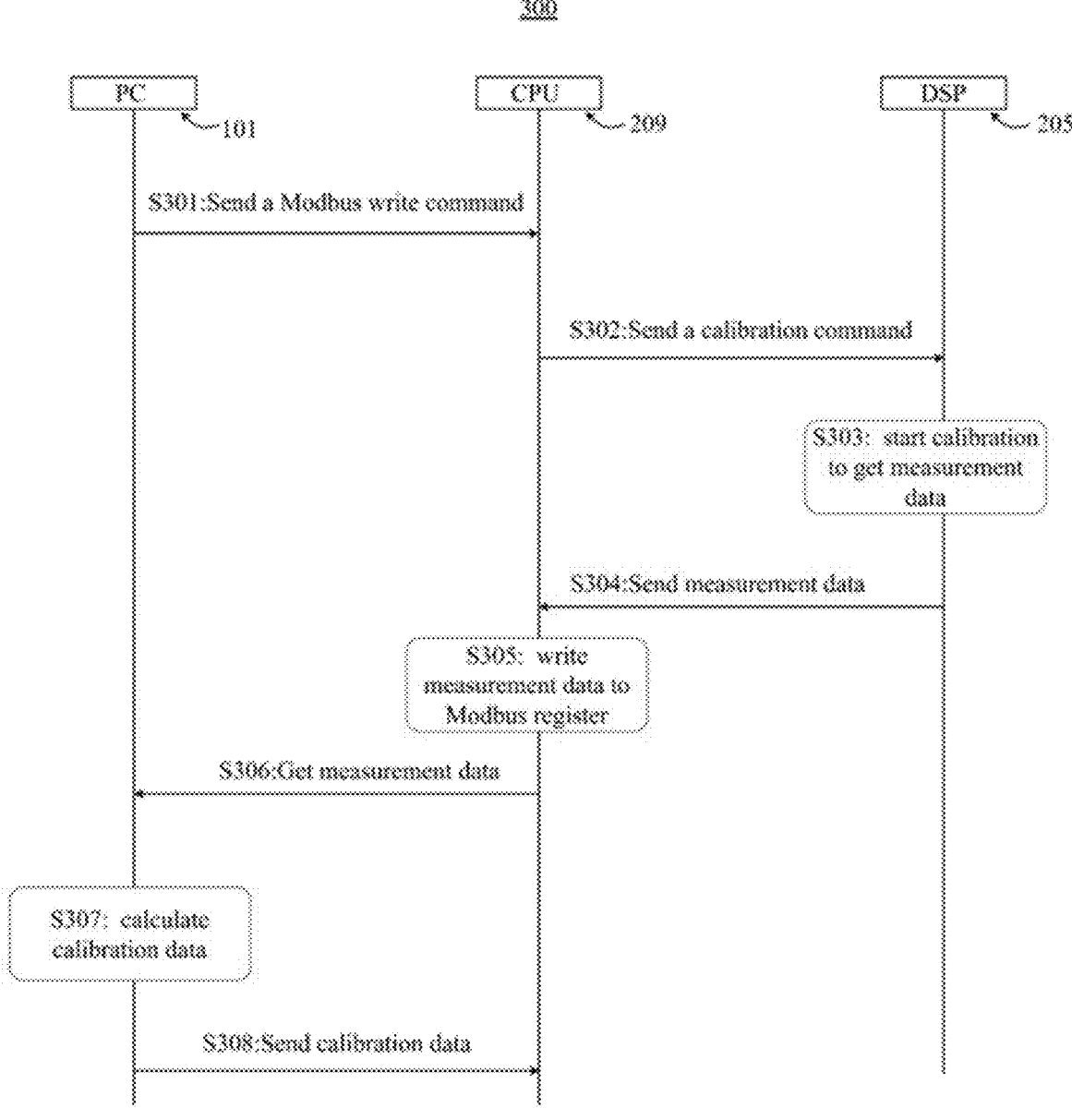
FIG. 3 presents a sequence diagram that illustrates the calibration process within an energy meter calibration system according to some embodiments of the present invention.

FIG. 3 presents a sequence diagram that illustrates the calibration process within an energy meter calibration system. This diagram details the interactions between a personal computer (PC), a central processing unit (CPU) combined with its operational software, and a digital signal processor (DSP) integrated with its specific calibration software within the energy meter. In this depiction, as part of the energy meter system 200 shown in FIG. 2, the CPU 209 and DSP 205 play critical roles. The CPU 209, through a combination of hardware capabilities and specialized software, manages operations and controls the system's workflow. Similarly, the DSP 205 utilizes its software to process electrical signals meticulously, ensuring precise and accurate calibration.

The calibration process begins at step S301, where the PC 101, serving as the command center, sends a Modbus register write command to the CPU 209. This command is essential as it includes parameters of the current reference source 103 for specific conditions such as 120 V, 1 A, with a power factor of 0.5, and a frequency of 50 Hz. Upon receiving this command, the CPU 209, assisted by its software, updates the relevant Modbus register with these parameters, setting the stage for the ensuing calibration activities.

Advancing to step S302, once the Modbus register is updated, the CPU 209's software constructs a comprehensive calibration command that includes the parameters of the current reference source 103 along with additional control commands crucial for the calibration process. This command is subsequently transmitted to the DSP 205 via the Serial Peripheral Interface (SPI), effectively preparing the DSP with all necessary data to initiate calibration.

In step S303, upon receiving the calibration command, the DSP 205's software analyzes the provided instructions and begins the calibration. This phase involves the DSP's software performing detailed measurements, such as calculating the phase angles of voltage and current for Phases A, B, and C. The precision of these measurements is crucial as they directly influence the subsequent evaluation and necessary adjustments to enhance the energy meter's accuracy.

Following the completion of the measurements, in step S304, the DSP 205's software transmits the collected data back to the CPU 209 via SPI. This data transfer includes comprehensive results from the calibration process, which the CPU 209's software then records by writing to a designated Modbus register in step S305. This registration may trigger a notification mechanism within the CPU 209, thereby alerting the PC 101 that new calibration data is available.

In step S306, the PC 101 retrieves the measurement data from the CPU 209. Equipped with this data, the PC 101 conducts a thorough analysis in step S307 to calculate the calibration data based on the measurements provided by the DSP 205. The results of this analysis are pivotal for determining any required modifications to enhance the meter's precision.

Concluding the sequence, step 308 involves the PC 101 sending the finalized calibration data back to the CPU 209, where it is stored in non-volatile memory 211 within the energy meter. This vital step ensures that the newly computed calibration settings are securely preserved and effectively employed to configure the analog-digital converter 204, thereby optimizing the meter's functionality for future operations.

In some analog-digital converters, including those featured in Analog Devices Inc's ADC7771, offset and gain registers are crucial components that facilitate precise calibration adjustments. These registers are specifically designed to fine-tune the conversion process by compensating for any inherent systematic errors and variability in sensor output or other measurement signals.

The calibration data, which is meticulously stored in non-volatile memory within the energy meter, plays a pivotal role during the system's initialization. Upon powering on the energy meter, this stored calibration data is promptly retrieved and used to accurately configure the offset and gain registers. This configuration is essential as it ensures that the measurements achieve a higher degree of accuracy and reliability.

This sequence diagram encapsulates a methodical and comprehensive approach to calibrating an energy meter using sophisticated electronic components and communication protocols. The process not only streamlines calibration but also guarantees that each phase of the operation is conducted with the utmost precision, significantly boosting the overall efficiency and accuracy of the energy metering system. This method provides a robust framework for reliable, high-precision calibration, crucial for maintaining the integrity and accuracy of energy consumption measurements across various applications.

Figure 4:
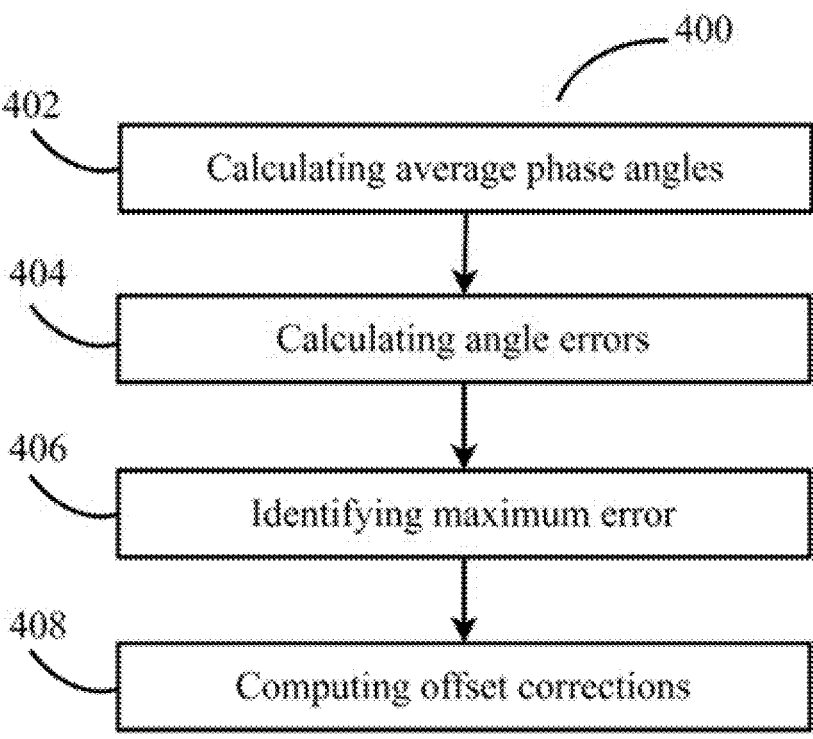
FIG. 4 presents a comprehensive flow chart illustrating the process of computing offset corrections for an analog-to-digital converter within an energy meter according to some embodiments of the present invention.

FIG. 4 presents a comprehensive flow chart detailing step S307 from FIG. 3, which focuses on the calibration of phase angles within a three-phase energy meter system using Fast Fourier Transform (FFT) data.

In step 402, the average phase angle for each measurement channel is computed. This calculation is crucial for establishing a baseline against which deviations are measured and corrected. The formula used is:

$$\bar{\theta}_i = \frac{\sum_{k=1}^{N} \theta_{ik}}{N} \tag{1}$$

where $\bar{\theta}_i$ is the average phase angle for the i-th measurement channel; $\theta_{ik}$ represents the k-th measured angle in the i-th measurement channel; N is the total number of accumulated measurements. N and $\theta_{ik}$ are typically collected by the PC 102 as measurement data during step S306.

The phase angles $\theta_{ik}$ are calculated using FFT in DSP 205. FFT is a powerful mathematical tool that transforms time-domain data into frequency-domain data, allowing for the precise calculation of phase angles from complex waveforms. This FFT-derived data is critical for accurately assessing the phase behavior over multiple cycles, thereby ensuring that any transient or steady-state deviations are captured and averaged out effectively.

For example $\bar{\theta}_0$ is the average phase angle for the first measurement channel (Phase A voltage channel); $\bar{\theta}_1$ is the average phase angle for the second measurement channel (Phase A current channel); $\bar{\theta}_2$ is the average phase angle for the third measurement channel (Phase B voltage channel); $\bar{\theta}_3$ is the average phase angle for the fourth measurement channel (Phase B current channel); $\bar{\theta}_4$ is the average phase angle for the fifth measurement channel (Phase C voltage channel); $\bar{\theta}_5$ is the average phase angle for the sixth measurement channel (Phase C current channel).

Following the averaging process, step 404 involves calculating the deviation of these measured angles from their expected theoretical values:

$$\epsilon_i = \bar{\theta}_i - \theta_{expected,i} \tag{2}$$

where $\epsilon_i$ is the angle error for the i-th measurement channel; $\theta_{expected, i}$ is the expected angle for the i-th measurement channel.

For $\epsilon_0 = \bar{\theta}_0 - 0$; $\epsilon_1 = \bar{\theta}_1 - 60$; $\epsilon_2 = \bar{\theta}_2 - 240$; $\epsilon_3 = \bar{\theta}_3 - 300$; $\epsilon_4 = \bar{\theta}_4 - 120$; $\epsilon_5 = \bar{\theta}_5 - 180$.

In a three-phase electrical system, the phase angles for voltage are typically separated by 120 degrees to ensure balanced power distribution across the system. This typical configuration leads to the expected phase angles for the voltage measurements to be set at 0, 120, and 240 degrees for Phases A, C, and B respectively. The offset for each corresponding current phase angle, factoring in a power factor of 0.5, involves an additional phase shift of 60 degrees due to the cosine component of the power factor, representing the phase difference between the voltage and the current. This phase shift is crucial in systems where power factor corrections are necessary, such as in energy metering applications, where accurate measurement of real power consumption is required.

Hence, the expected angles for the current measurements are set at 60, 180, and 300 degrees for Phases A, C, and B respectively. These angles reflect the phase shift introduced by the power factor, aligning the current phase angles correctly with their corresponding voltage phase angles to accurately calculate power consumption in the system. The specific values:

$\epsilon_0 = \bar{\theta}_0 - 0$: This calculation assumes that the expected phase angle for Phase A voltage is 0 degrees.

$\epsilon_1 = \bar{\theta}_1 - 60$: This reflects the expected 60-degree lag due to the power factor for Phase A current.

$\epsilon_2 = \bar{\theta}_2 - 240$ and $\epsilon_4 = \bar{\theta}_4 - 120$: These are the expected angles for Phases B and C voltages, spaced 120 degrees apart from Phase A voltage.

$\epsilon_3 = \bar{\theta}_3 - 300$ and $\epsilon_5 = \bar{\theta}_5 - 180$: These calculations for Phases B and C currents also reflect a 60-degree phase shift due to the power factor from their respective voltage phases.

Step 406 identifies the largest error from the set of calculated errors, which will dictate the magnitude of adjustments needed in subsequent calibration steps:

$$\epsilon_{max} = \max(|\epsilon_i|) \tag{3}$$

Determining the maximum error is essential for prioritizing which phase adjustments are most critical and ensuring that the calibration process targets the most significant inaccuracies first.

In step 408, offset corrections for each channel are calculated to adjust the ADC settings as the following formula 4:

$$\Delta_i = \left\lceil C - \left| \frac{\epsilon_i - \epsilon_{max}}{K} \right| \right\rceil \tag{4}$$

where $\Delta_i$ is the offset correction for the i-th measurement channel; C is a predefined constant, which can often be set to 31, depending on the ADC's calibration specifications; K is phase reference constant. The symbols $\lceil \ \rceil$ represent the mathematical "ceiling function," which rounds up the result of the expression within to the nearest integer.

In some embodiment, K can be calculated as the following formula 5:

$$K = \frac{360}{S/F} \tag{5}$$

where S is the sample rate of ADC 204; F is the standard frequency of electrical distribution system 201 such as 50 Hz, or 60 Hz.

The offset corrections, as computed from the described methodology, are effectively utilized as essential calibration data. This calibration data is pivotal for configuring the settings of the Analog-Digital Converter (ADC) 204 to enhance measurement accuracy. By applying these calculated corrections to the ADC, systematic measurement errors can be significantly reduced, thereby improving the precision of the energy meter's outputs.

Embodiments of the teachings of the present disclosure have been described in an illustrative manner. It is to be understood that the terminology that has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. A system for calibrating energy meters comprising:
a computing device equipped with calibration software stored on a non-transitory computer-readable medium for managing calibration activities and interfacing with multiple energy meters, wherein each energy meter includes a central processing unit (CPU) and a digital signal processor (DSP);
a network switch connected to the computing device via an Ethernet cable, facilitating communication with the energy meters;
   a reference source connected to each of the energy meters via a power cable, capable of delivering a three-phase power output that is configurable through the computing device;
   wherein the DSP is configured to measure phase angles for each measurement channel in response to a calibration command, triggered after the CPU receives a predefined control signal from the computing device;
   wherein the measured phase angles are transmitted to the computing device through the CPU via the network switch;
   wherein the computing device computes an offset correction for each measurement channel based on the received measured phase angles, the offset correction being computed by; calculating average phase angles for each measurement channel, determining phase angle errors by comparing each calculated average phase angle to an expected value, identifying a maximum phase angle error among all measurement channels, and computing the offset correction using the maximum phase angle error and a phase reference constant, the offset correction being computed by; calculating average phase angles for each measurement channel, determining phase angle errors by comparing each calculated average phase angle to an expected value, identifying a maximum phase angle error among all measurement channels, and computing the offset correction using the maximum phase angle error and a phase reference constant;
   wherein the computed offset corrections are sent back to the CPU for adjusting the settings of an analog-to-digital converter within the energy meters to align measurement accuracy with calibrated standards.

2. The system of claim 1, wherein the reference source is further configured to adjust its output based on commands from the computing device, allowing for variations in voltage, current, power factor, and frequency to test meter performance under different electrical conditions.

3. The system of claim 1, wherein the calibration software is configured to receive real-time feedback from the energy meters during the calibration process, enabling dynamic adjustments to the calibration parameters based on the feedback received.

4. The system of claim 1, further comprising a user interface on the computing device that displays the progress and results of the calibration process, providing visual confirmation and logs of calibration accuracy for each connected energy meter.

5. The system of claim 1, wherein the computing device uses Modbus TCP/IP protocol for communication, facilitating standardized and secure data exchange with the energy meters.

6. A method for calibrating energy meters using a computing device interfaced with a plurality of energy meters through a network switch, each energy meter including a central processing unit (CPU), a digital signal processor (DSP), and an analog-to-digital converter, and a reference source connected to each energy meter and delivering a three-phase power output, the method comprising: configuring, by the computing device, the reference source to deliver the three-phase power output at specified voltage, current, power factor, and frequency parameters transmitting, by the computing device, a calibration command to each energy meter via the network switch, causing the CPU of each energy meter to instruct the DSP to measure phase angles for each measurement channel from the three-phase power output received from the reference source: receiving, by the computing device from each energy meter via the network switch, the measured phase angles for each measurement channel;
   calculating average phase angles for each measurement channel using the formula:

$$\bar{\theta}_i = \frac{\sum_{k=1}^{N} \theta_{ik}}{N} \tag{1}$$

wherein $\bar{\theta}_i$ represents the average phase angle for the i-th measurement channel, $\theta_{ik}$ represents the k-th measured angle in the i-th measurement channel, and N is the total number of accumulated measurements;
   determining phase angle errors by comparing each calculated average phase angle to its expected value using the formula:

$$\epsilon_i = \bar{\theta}_i - \theta_{expected,i} \tag{2}$$

identifying the maximum phase angle error Emax among all measurement channels using the formula:

$$\epsilon_{max} = \max(|\epsilon_i|) \tag{3}$$

computing offset corrections for each measurement channel to adjust analog-to-digital converter settings in the energy meters using the formula:

$$\Delta_i = \left\lceil C - \left| \frac{\epsilon_i - \epsilon_{max}}{K} \right| \right\rceil \tag{4}$$

wherein $\Delta_i$ is the offset correction for the i-th measurement channel; C is a predefined constant, and K is a phase reference constant; and transmitting, by the computing device, the computed offset corrections to the CPU of each energy meter for storage in non-volatile memory and for configuring offset registers of the analog-to-digital converter within each energy meter, thereby aligning measurement accuracy of each energy meter with calibrated standards.

7. The method of claim 6, wherein the phase reference constant K is computed according to the formula:

$$K = \frac{360}{S/F} \tag{5}$$

wherein S is the sample rate of the analog-to-digital converter, and F is the standard frequency of electrical distribution system.

8. The method of claim 6, wherein the measurement channels comprise:

a phase A voltage channel,
a phase A current channel,
a phase B voltage channel,
a phase B current channel,
a phase C voltage channel, and
a phase C current channel.

* * * * *